United States Patent [19]

Ducourant

[11] Patent Number: 5,115,153
[45] Date of Patent: May 19, 1992

[54] DIFFERENTIAL STAGE COMPRISING MESFETS

[75] Inventor: Thierry Ducourant, Crosne, France

[73] Assignee: U.S. Philips Corporation, New York, N.Y.

[21] Appl. No.: 367,520

[22] Filed: Jun. 16, 1989

[30] Foreign Application Priority Data

Jun. 17, 1988 [FR] France .................. 88 08147

[51] Int. Cl.[5] .................. H03K 5/08; H03K 17/16
[52] U.S. Cl. .................. 307/491; 307/279; 307/362; 307/494; 307/530
[58] Field of Search ............ 307/362, 279, 530, 491, 307/494

[56] References Cited

U.S. PATENT DOCUMENTS

| | | | |
|---|---|---|---|
| 4,572,974 | 2/1986 | Frieling et al. ............... | 307/362 |
| 4,602,167 | 7/1986 | Yukawa ........................ | 307/279 |
| 4,656,371 | 4/1987 | Binet et al. ................... | 307/362 |
| 4,814,642 | 3/1989 | Kleks .......................... | 307/362 |
| 4,825,100 | 4/1989 | Caspell ........................ | 307/279 |

Primary Examiner—John Zazworsky
Attorney, Agent, or Firm—Bernard Franzblau

[57] ABSTRACT

An integrated semiconductor circuit made up of a differential stage which comsists of a differential pair of field effect transistors (10, 11) having outputs (34, 35) which are coupled to the inputs of an output stage or sub-circuit (31, 32, 51, 52) for controlling same, and also including a load circuit ($R_4$, $R_3$). The circuit provides smoothing means for smoothing fluctuations of an output impedance of the differential transistor pair (10,11) during switching thereof.

19 Claims, 6 Drawing Sheets

DIFFERENTIAL STAGE COMPRISING MESFETS

BACKGROUND OF THE INVENTION

This invention relates to an integrated circuit comprising a differential-transistor-pair with MESFETs which are coupled to a supply voltage via a respective load, a node between the respective MESFET and its associated load being coupled to a sub-circuit for controlling the same.

The invention is used, for example, in a latch-type comparator which serves to compare an analog input voltage $V_{IN}$ with an analog reference voltage $V_{REF}$ and which is formed by field effect transistors.

The invention can also be used, for example, in a synchronized comparator circuit comprising at least two of these circuits connected in parallel.

As an example, the invention may be used for realizing an analog-to-digital converter which is referred to as a parallel converter and in which the analog input signal is applied to the inputs of several parallel comparator circuits in order to obtain a digital output signal. In the comparator circuits the input voltage is compared with a reference voltage which differs for each comparator circuit. The output signals of the comparator circuits are converted into a digital output signal by means of a decoding device. The synchronized comparator used in such parallel analog comparator circuits generally has a construction as described above.

A circuit of this kind is known, inter alia, from European Patent Application No. 85 201742.5, which corresponds to U.S. Pat. No. 4,649,293 (Mar. 10, 1987).

This U.S. Patent, hereby incorporated by reference, discloses a voltage comparator which is realized by means of transistors, each of which comprises a control terminal, a first main terminal and a second main terminal. The comparator comprises:

an acquisition stage which serves to compare an analog input voltage ($V_{IN}$) with an analog reference voltage ($V_{REF}$) and to output the comparison result in the form of an intermediate signal ($V_M$) and its complement ($\overline{V}_M$). This stage includes two transistors which constitute a first differential pair. The input voltage ($V_{IN}$) and the reference voltage ($V_{REF}$) are applied to the respective control terminals of these transistors, whose first main terminals form a connection point which serves to receive a control current and whose second main terminals are coupled, via a respective resistive load, to a first d.c. power supply terminal ($V_{DD}$) thus to supply the intermediate signal and its complement, respectively;

a sub-circuit formed as a memory stage which is coupled to the acquisition stage and which serves to produce the logic states determined by the signals supplied by the acquisition stages. The memory stage includes two transistors which form a second differential pair connected clocked bistable storage circuit, the signals supplied by each branch of the acquisition stage being applied to the respective control terminals of these transistors whose first main terminals form a connection point and whose second main terminals are cross-wise coupled to the control terminals of the transistors of the second pair, the latter connection points constituting the outputs of said memory stage.

In the known circuit:

the connection point of the first differential pair is coupled to a second d.c. power supply terminal $V_{SS}$ (e.g. ground) via a current source transistor;

the connection point of the second differential pair is connected directly to the potential of the second d.c. power supply terminal $V_{SS}$ (e.g. ground);

the second differential pair is coupled to a third differential pair which includes two transistors which are connected parallel to the transistors of the second differential pair and whose control terminals receive a clock signal (C).

Moreover: the second main terminals of the first differential pair are coupled to the sub-circuit, more particularly to the respective control terminals of the second differential pair, each time via a coupling resistance, and the current source transistor of the first differential pair can be controlled by the clock signal in one version or by a third d.c. supply voltage in a second version.

This known circuit has a number of drawbacks.

First of all, the output conductance of each of the transistors of the acquisition stage, which are field effect transistors of the MESFET type, changes as a function of the frequency.

Consequently, the impedance at the drain of these MESFETs can vary by as much as a factor 3. Thus, in the case of high frequencies this impedance becomes three times lower than in the case of low frequencies.

In the case of a transition, the reference voltage $V_{REF}$ does not change and the input voltage $V_{IN}$ is subject to an extremely fast variation so that the current derived from the drain of the transistor receiving the input voltage $V_{IN}$ assumes a high transitory value corresponding to the conductance of this transistor, which has become very high due to said rapid transition.

Subsequently, the current derived from the drain of the transistor receiving this input voltage $V_{IN}$ drops to a lower value which corresponds to the static value of the output conductance of this transistor.

In the case of fast switching of $V_{IN}$ about $V_{REF}$, at the electrical level this becomes manifest as low frequency decays of the differential output voltage. As a percentage, such decay may reach 10% of the output dynamics. If, for example, before a switching operation in a state where $V_{IN} \neq V_{REF}$ the voltage difference between the output and the complementary output is 1 V, after fast switching, during which $V_{IN}$ has become equal to $V_{REF}$, the output and the complementary output maintain a level difference in the order of 0.1 V for a non-negligibly short period of time before assuming the same value.

SUMMARY OF THE INVENTION

The present invention proposes a circuit in which this decay effect becomes negligibly small.

In accordance with the invention, this object is achieved by means of a circuit as described in the introduction, characterized in that the circuit comprises smoothing means for smoothing fluctuations of an output impedance of said first differential transistor pair during switching.

In one embodiment in accordance with the invention, the circuit is characterized in that the smoothing means comprises, connected between each of said MESFETs and its associated load, a respective cascode transistor which is biased at a predetermined voltage, a node between the respective cascode transistor and the relevant load being coupled to the sub-circuit.

This cascode stage isolates the differential stage from its loads in which a voltage gain occurs. Thus, it is achieved that a voltage gain no longer exists at the level of the outputs of the differential stage, thus minimizing the consequences of the fluctuations of the output conductance of this stage as a function of the frequency.

In an embodiment of the invention, the circuit is further characterized in that the smoothing means comprise a feedback means which controls each of the MESFETs of the differential transistor pair by a signal indicative of a voltage across the other MESFET of the differential pair.

This counter-effect stabilizes the output voltages of the differential stage.

In a preferred embodiment, the circuit is characterized in that each MESFET of the differential transistor pair comprises a first gate electrode and a second gate electrode for receiving input signals and for connection to the other MESFET of the differential pair, respectively.

In this embodiment, the circuit is particularly compact and hence attractive for high-density integration.

Therefore, the circuit formed by the differential stage, the sub-circuit, the loads controlled in accordance with the invention and the smoothing means in accordance with the invention, is particularly suitable for forming the acquisition stage of a synchronized comparator for comparing an analog input voltage $V_{IN}$ with an analog reference voltage $V_{REF}$, which voltages are applied to the inputs of the differential stage. The comparator also comprises a memory stage which is connected to the acquisition stage via the loads.

Thus, not only the effects of the fluctuations of the output conductance of the acquisition stage as a function of the frequency are minimized because the cascode stage isolates the acquisition stage from the loads of the memory stage in which a voltage gain occurs, but the cascode stage also provides an increase of the bandwidth and of the gain of the entire comparator.

BRIEF DESCRIPTION OF THE DRAWING

The invention will be described in detail hereinafter with reference to the accompanying diagrammatic drawings; in which:

FIG. 2b is a schematic diagram of the system of FIG. 2a;

DESCRIPTION OF THE PREFERRED EMBODIMENTS

Figure 1:
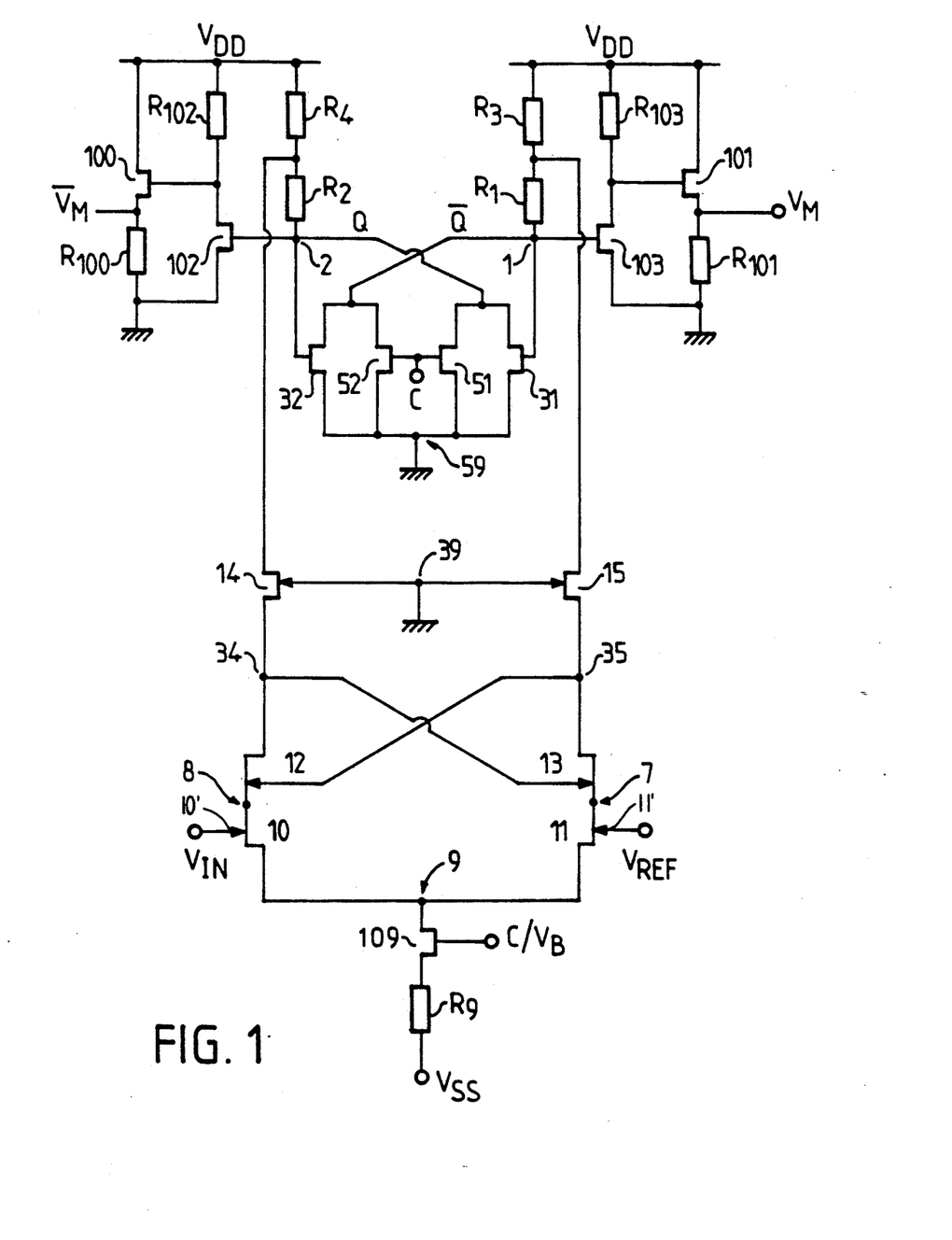
FIG. 1 shows a comparator circuit in accordance with the invention.

FIG. 1 shows a synchronized comparator which is, for example, attractively realized by means of enhancement-type field effect transistors which are made, for example, of gallium arsenide and whose pinch-off voltage $V_T > 0$ so that they are normally pinched off in the absence of a signal.

This synchronised comparator comprises first of all an acquisition stage which is formed by two source-coupled transistors 10 and 11 whose gates receive the analog input voltage $V_{IN}$ and the analog reference voltage $V_{REF}$, respectively.

The sources of the transistors 10 and 11 are coupled to the connection point 9 and are further connected to the negative supply voltage $V_{SS}$ via a current source transistor 109 which is controlled by the clock signal C and whose source is connected to $V_{SS}$ via a resistance $R_9$.

This synchronized comparator also comprises a sub-circuit which includes a memory stage which is formed by two transistors 32 and 31 which are coupled to the connection point 59 by way of their sources. This connection point is connected directly to ground potential.

The sub-circuit also comprises two transistors 52 and 51 for control of the memory stage and which are connected parallel to the transistors 32 and 31, respectively, and which are controlled by a control or clock signal C. The sub-circuit coupled to nodes 1 and 2 thus comprises a clocked bistable storage circuit.

Thus, when the acquisition stage is activated, the memory stage immediately assumes the state 0. As is known, for suitable operation of such an acquisition stage coupled to a memory stage it is absolutely necessary that the differential pair 31, 32 of the memory stage be de-activated at exactly the instant at which the differential pair of the acquisition stage is activated. The circuit would otherwise exhibit instabilities. This condition is often very difficult to comply with, notably when the acquisition stage and the memory stage are controlled by different clock signals.

This drawback is circumvented because the memory stage and the acquisition stage are controlled by the same control signal, i.e. the clock signal C.

The gates 2 and 1 of the transistors 32 and 31 are cross-wise coupled to the drains of the transistors 31 and 51, and 32 and 52 respectively. The gates of the transistors 32 and 31 also receive, via respective coupling resistances $R_2$ and $R_1$, the signals supplied by the acquisition stage.

The connection points 2 and 1 constitute the output of the assembly formed by the acquisition stage and the memory stage.

Figure 3:
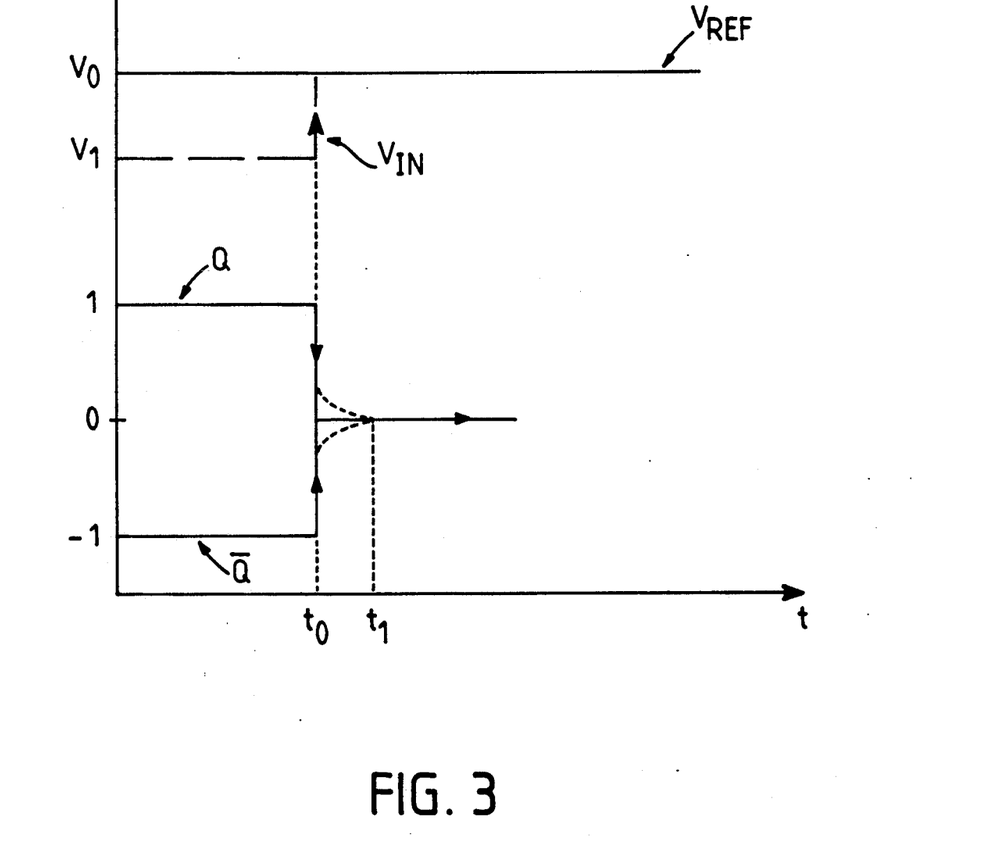
FIG. 3 shows an example of the sequencing of the signals in the circuit shown in FIG. 1.

In the case of a transition as shown in FIG. 3, during which the reference signal $V_{REF}$ denoted by a non-interrupted line is constant and the input signal $V_{IN}$ denoted by an interrupted line quickly changes over from the level $V_1$ to the level $V_0$ at the instant $t_0$, the signals Q and $\overline{Q}$ present at the nodes 1 and 2 should also quickly change over from the states 1 and −1, respectively, to the same state 0.

However, if the transition of $V_{IN}$ is abrupt, as stated above the output conductance of the transistor 10 which receives $V_{IN}$ becomes three times higher than the output conductance of the transistor 11 at the instant $t_0$ of the transition.

Consequently, if the drain voltages of the transistors 10 and 11 are applied directly to the memory stage as in the prior art via the coupling resistances $R_1$ and $R_2$, the signals Q and $\overline{Q}$ at the nodes 1 and 2 will not instantaneously assume the level 0 but only after a period of time $t_1$, the time difference $t_0 - t_1$ not being negligibly small.

FIG. 3 shows, by way of dotted lines, that at the instant $t_0$ of the fast transition the delay could reach a value of 10% of the value of the voltage corresponding to the level difference between Q and $\overline{Q}$ before the transition.

Therefore, in accordance with the invention this effect is reduced by isolating the differential stage from the loads in which a voltage gain occurs.

Thus, a voltage gain no longer exists at the level of the drains of the transistors 10 and 11. The differential transitions of the drain-source voltage of these transistors are thus limited and the effects of the fluctuations of the output conductance of the transistor 10 as a function of the frequency are minimized.

In accordance with the invention, this object is achieved by smoothing means made up of a cascode stage which is formed by transistors 14 and 15. The drains of the transistors 14 and 15 of the cascode stage are connected to the d.c. supply voltage $V_{DD}$ via the load resistances $R_4$ and $R_3$, respectively. The coupled gates of these transistors are connected to ground. Their sources are connected to the nodes 34 and 35.

The nodes 34 and 35 (see FIG. 1) then exhibit a low differential voltage gain.

This differential stage and the cascode stage which supplements it is to be used in accordance with the invention for realizing the acquisition stage of a comparator.

However, this differential stage comprising the same smoothing means could also be used for other circuits forming loads.

In the comparator circuit which is described herein by way of example, the cascode stage isolates the acquisition stage from the memory stage, increases the bandwidth and also the gain of the entire comparator stage.

If, for example at the instant $t_O$ of a fast transition the level difference between the signals Q and $\overline{Q}$ at the nodes 2 and 1, respectively, is 1 V, the level difference between the signals present on the nodes 34 and 35 will only be in the order of 0.3 V.

Operation will be further improved by providing, as is shown in FIG. 1, additional smoothing means in the form of a differential acquistion stage which is formed by two dual-gate transistors.

The first transistor 10 of the differential pair includes the gates 10' and 12.

The second transistor 11 of the differential pair includes the gates 11' and 13.

As has already been stated, the gates 10' and 11' perform the differencing operation between the input signal $V_{IN}$ and the reference signal $V_{REF}$.

The gates 12 and 13 constitute a stage which is controlled by the differential pair 10 and 11.

In accordance with the invention, the outputs of the differential pair, formed by the drains 34 and 35, are couteracted via the inputs of this stage, formed by the gates 12 and 13 of the dual-gate transistors 10 and 11.

Thus, the two upper gates 12 and 13, which are crosscoupled to the drains 35 and 34, respectively, of these dual-gate transistors stabilize the intermediate drain voltages at the points 7 and 8 of these dual-gate transistors.

The voltage decay percentages of the signals Q and $\overline{Q}$ are then reduced from the prior art value of 10% to a value of 0.6% as demonstrated by the non-interrupted curve of FIG. 3.

When the differential stage circuit comprising the means in accordance with the invention is used for realizing an acquisition stage for a comparator circuit, the switching speed at the output of the stage can be increased, and hence also the speed at which the comparison result is produced.

This comparator thus forms a high performance element and can be used for realizing ultrafast and precise analog-to-digital converters.

A third d.c. supply voltage $V_B$ may be applied to the gate of the current source transistor 109, instead of the control signal C, in order to render this transistor continuously conductive (see FIG. 1). The acquisition stage then operates continuously and instability phenomena are also avoided.

This version is of particular interest when the comparator is to be limited to the single acquisition stage coupled to the memory stage.

Figure 2A:
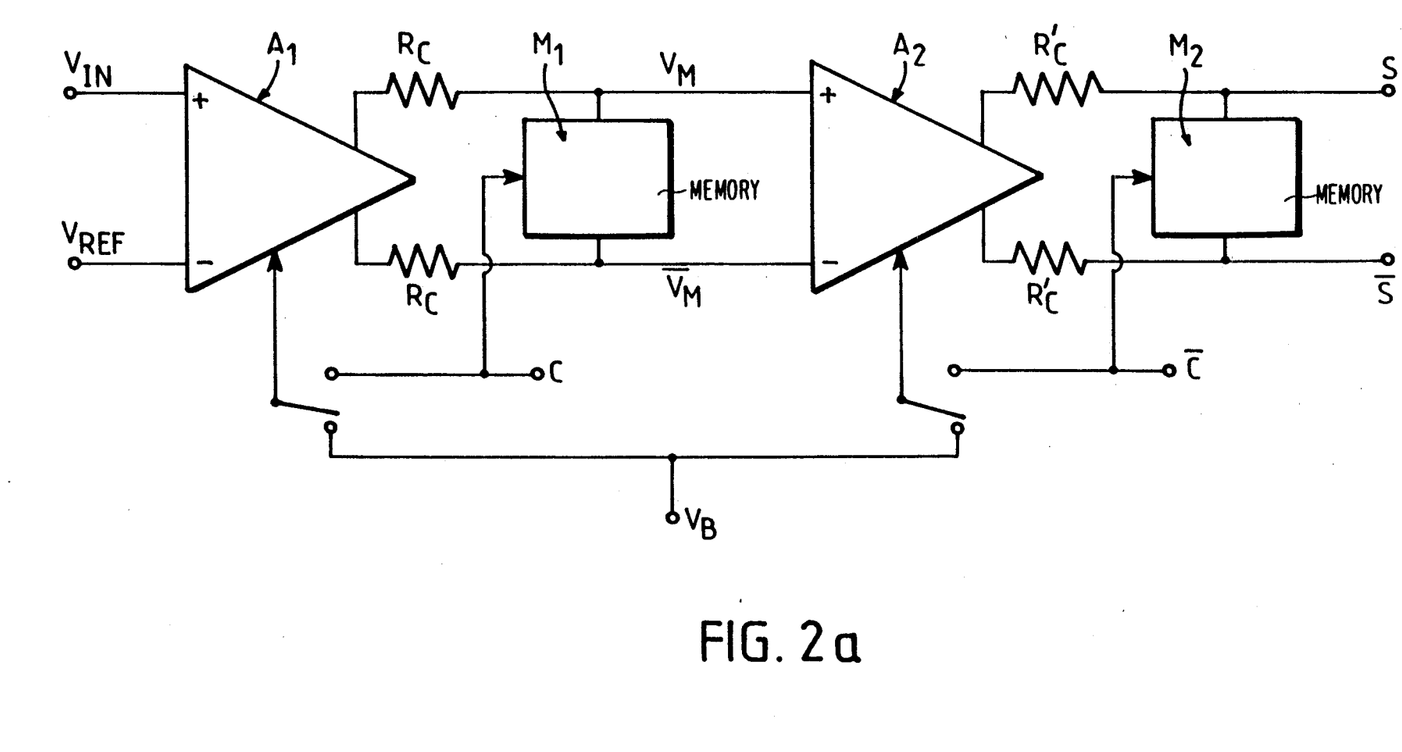
FIG. 2a shows a block diagram of a system consisting of two comparator circuits in accordance with the invention.
Figure 2B:
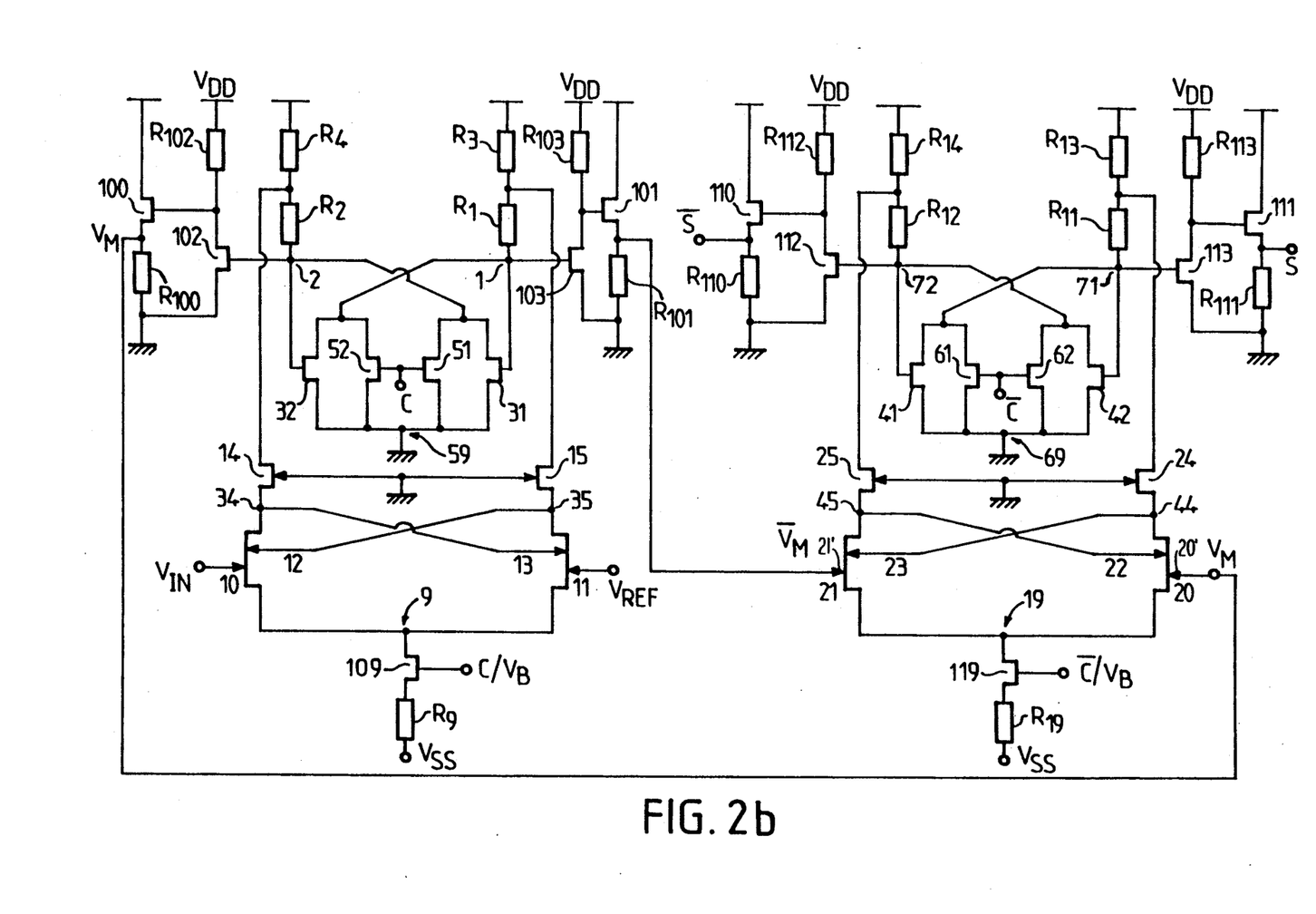

The performance of the comparator in accordance with the invention can be further improved by means of a system consisting of two comparators as described above which are grouped in accordance with the diagrams shown in the FIGS. 2a and 2b.

To this end, the output nodes 1 and 2 of the first comparator stage are provided with invertor-followers. In particular, at the connection node 2 the inverter stage is formed by a transistor 102 and the resistance $R_{102}$ and the follower stage is formed by a transistor 100 and resistance $R_{100}$.

In the same manner, for connection node 1, the inverter stage is formed by transistor 103 and resistance $R_{103}$, and the follower stage by transistor 101 and resistance $R_{101}$.

The inverter stage is provided to increase the high level at the output of the memory stage. The follower stage is provided to decrease the output impedance of the combination of the acquisition stage-memory stage.

The outputs $V_M$ and $\overline{V}_M$ of these stages are available at the node common to transistor 100 and $R_{100}$, and at the node common to transistor 101 and $R_{101}$, respectively.

As shown in FIG. 2a, the system of synchronized comparators according to the invention comprises an acquisition stage $A_1$, coupled to a first memory stage M1 via coupling resistance $R_C$ and an amplifier stage $A_2$ having a structure similar to that of acquisition stage $A_1$, coupled to a second memory stage $M_2$ via coupling resistances $R'_C$.

The acquisition stage receives at one input the analog signal $V_{IN}$ and at the other input the analog reference signal $V_{REF}$. The outputs of acquisition stage $A_1$ that are coupled to memory stage $M_1$ deliver the intermediate signals $V_M$ and $\overline{V}_M$ (the logic couplement of $V_M$).

The acquisition stage $A_1$ and memory stage $M_1$ are controlled by the same clock signal C.

The amplifier stage $A_2$ receives the intermediate signal $V_M$ and its complement $\overline{V}_M$. Its outputs are coupled to those of the memory stage $M_2$ to make available a digital output signal that is the difference between the input signal $V_{IN}$ and the reference signal $V_{REF}$.

The amplifying stage $A_2$ and the memory stage $M_2$ are each controlled by a signal that is the complement $\overline{C}$ of the clock signal C.

In another version the acquisition stage and the amplifier stage are controlled by means of a fixed potential $V_B$.

FIG. 2a shows a system of this kind in the form of functional blocks. The assembly formed by the amplifier stage $A_2$ and the second memory stage $M_2$ has exactly the same structure and the same operating principle as the assembly formed by the first acquisition stage $A_1$ and the first memory stage $M_1$. Only the transistors and the coupling resistances or load resistances may exhibit slightly different values for better adaptation.

The circuit diagram of this assembly is shown in FIG. 2b.

The amplifier stage $A_2$ is thus formed by two transistors 21 and 20 which are coupled by way of their sources and whose gates receive the intermediate signal $V_M$ and its complement $V_{\overline{M}}$, respectively, which are available at the sources of the transistors 100 and 101 of the follower stages described above. The sources of transistors 20 and 21 are coupled to the connection point 19 and from there are connected to the drain of a current source transistor 119, which is controlled by the complementary clock signal $\overline{C}$, and whose source is connected to $V_{SS}$ via a resistance $R_{19}$.

The second memory stage $M_2$ is formed by two transistors 41 and 42 which are coupled to the connection point 69 by way of their sources. This connection point is directly connected to ground potential.

This memory stage is controlled by two transistors 61 and 62 which are connected parallel to the transistors 41 and 42, respectively, and which are controlled by the complementary clock signal C.

Thus, the memory stage immediately assumes the state O when the amplifier stage is activated.

As before, a d.c. supply voltage $V_B$ may be applied to the gate of the current source transistor 119 in order to render this transistor continuously conductive. The amplifier stage then operates continuously.

The cross-wise coupled gates 72 and 71 of the transistors 41 and 42 receive the signals at the drains of the transistors 42, 62 and 41, 61, respectively. The gates of the transistors 41 and 42 also receive, via respective coupling resistances $R_{12}$ and $R_{11}$, the signals supplied by the amplifier stage $A_2$.

The connection points 71 and 72 form the output of the assembly consisting of the amplifier stage and the second memory stage.

In order to isolate the amplifier stage from the memory stage of the second comparator, as before there may be provided a cascode stage which is formed by the transistors 25 and 24 whose coupled gates are connected to ground, whose drains are connected to $R_{12}$ and $R_{11}$, and whose sources are connected to the drains of the transistors of the differential pair of the amplifier stage.

Moreover, as in the first comparator the transistors of the differential pair of the amplifier stage may be dual-gate transistors whose lower gates 20' and 21' receive the signals $V_M$ and $V_{\overline{M}}$ and whose upper gates 22 and 23 are cross-wise connected to the drain of the opposite transistor of this pair.

Moreover, small inverter follower stages may be connected to the nodes 71 and 72. For the connection point 72 the inverter stage is formed by the transistor 112 and the load resistance $R_{112}$, the follower stage being formed by the transistor 110 and the resistance $R_{110}$.

Similarly, for the connection point 71 the inverter stage is formed by the transistor 113 and the resistance $R_{113}$, the follower stage being formed by the transistor 111 and the resistance $R_{111}$.

The digital output signal of the comparator is available at the source of the follower transistor 111 and its complement S is available at the source of the follower transistor 110.

Figure 4:
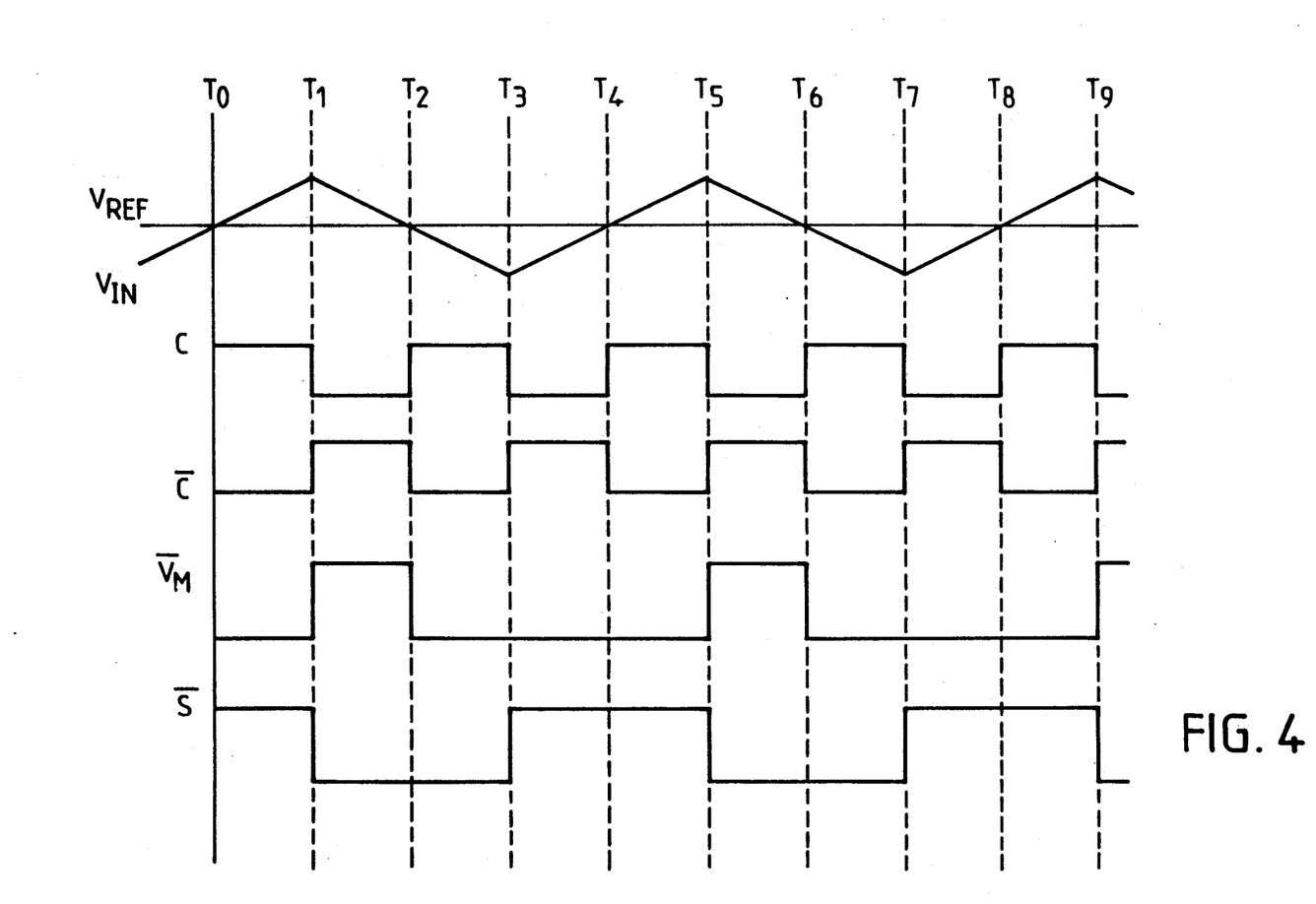
FIG. 4 shows the sequencing of the signals in the system shown in FIG. 2b.

As appears from FIG. 4, when the difference between the analog input signal $V_{IN}$ and the analog reference signal $V_{REF}$ applied to the acquisition stage is positive and when the negative-going edge of the clock signal C arrives at the instant $T_1$, the complementary signal $V_M$, for example, is stored in the high state and the complementary output signal $\overline{S}$ becomes low.

When at the instant $T_2$ a positive going edge of the clock signal C arrives, the difference thus becoming negative, the complementary signal $V_{\overline{M}}$ becomes low for acquisition and the complementary output signal S is passed to the memory in the low state.

In response to the negative-going edge of the clock signal at the instant $T_3$, the difference still being negative, the intermediate complementary signal $V_{\overline{M}}$ is stored in the low state and the complementary output signal $\overline{S}$ is high for acquisition.

Finally, at the instant $T_4$ the difference becomes positive in response to a positive-going edge of the clock signal C and the complementary output signal becomes high for storage.

Thus, the phase of the output signal S follows the sign of the difference between the input signal $V_{IN}$ and the reference signal $V_{REF}$.

Figure 5:
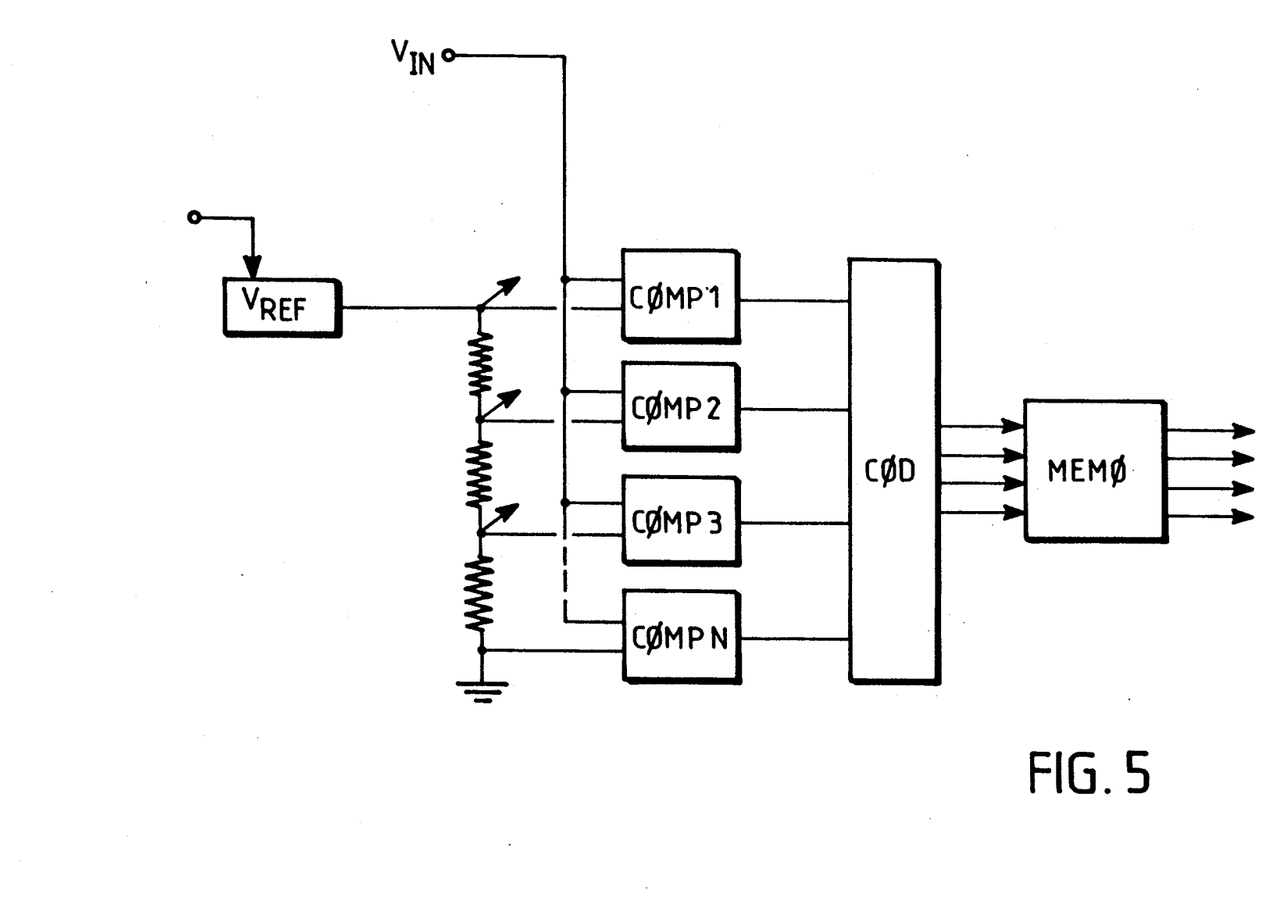
FIG. 5 shows an analog-to-digital converter realized by means of a circuit in accordance with the invention.

The analog-to-digital converter shown in FIG. 5 comprises several comparators (COMP1, ... COMP N) which are connected in parallel and each of which comprises two inputs. The analog input voltage $V_{IN}$ to be converted is applied to one input of each comparator. The other input of each comparator receives a reference voltage which is obtained by applying a reference voltage to the terminals of a series connection of several resistances. When all resistances are equal, an arithmetical progression of reference voltages is obtained wherein each pair of successive reference voltages are in the same ratio. In order to produce reference voltages forming a series $\frac{1}{2}$, $\frac{1}{4}$, $\frac{1}{8}$ etc, the associated resistances should be proportional to $2^n$, $2^{n-1}$, etc., the latter voltages being used only for indicating an overshoot bit. The outputs of the comparators are connected to the inputs of a logic encoding device (COD) which supplies an n-bit digital signal to the next output in an arbitrary code. This code may be, for example, a Gray code. The construction of the encoding device is subject to the code required, but is not described in detail herein because this encoding device does not actually form a part of the invention. A memory (MEMO) may be coupled to the output of the encoding device in order to save the information of the encoding device during at least one part of the clock period, thus enabling synchronization of the comparators. The clock signal required for the comparators and the memories is supplied by an external circuit. These circuits may be integrated on the same semiconductor substrate.

In the case where the described comparator is realized by means of gallium arsenide transistors having a Schottky gate, the voltages $V_{IN}$, $V_{REF}$, $V_M$, $V_{\overline{M}}$, S and $\overline{S}$ have a value of 0.7 V for the high level and 0.1 V for the low level.

The threshold voltages of the transistors are $V_T = 0.1$ V.

The d.c. supply voltages are:
for the first: $V_{DD} = 2$ V
for the second: $V_B = -2.5$ V, if any
for the third: $V_{SS} = -3$ V.

The characteristic values of the gate widths L and the resistances R are stated in the following table:

TABLE I

| Transistors | | Resistances | |
|---|---|---|---|
| No. | l in μm | Lg | No | R |
| 10, 12 | 50 μm | 0.7 | $R_4$, $R_3$ | 2.7 kΩ |
| 11, 13 | 50 μm | 1 | | |

TABLE I-continued

| Transistors | | | Resistances | |
|---|---|---|---|---|
| No. | l in μm | Lg | No | R |
| 32, 31 | 20 μm | 0.7 | $R_2, R_1$ | 2.7 kΩ |
| 52, 51 | 20 μm | 0.7 | $R_{102}, R_{103}$ | 7 kΩ |
| 14, 15 | 20 μm | 0.7 | | |
| 102, 112 | 10 μm | | $R_{100}, R_{101}$ | 3 kΩ |
| 100, 110 | 30 μm | | | |
| 13 | 30 μm | | | |
| 21, 23 | 25 μm | 1 | | |
| 20, 22 | 25 μm | 0.7 | $R_{14}, R_{13}$ | 1.6 kΩ |
| 41, 42 | 20 μm | 0.7 | $R_{12}, R_{11}$ | 1.6 kΩ |
| 61, 62 | 20 μm | 0.7 | $R_{112}, R_{113}$ | 7 kΩ |
| 24, 25 | 20 μm | 0.7 | | |
| 122, 132 | 10 μm | | $R_{110}, R_{111}$ | 3 kΩ |
| 130, 120 | 30 μm | | | |
| 23 | 30 μm | | | |

The use of an identical comparator for realizing an analog-to-digital converter also represents an advantage where the invention is in the form of an integrated circuit.

To those skilled in the art it will be evident that many alternatives are feasible without departing from the scope of the present invention as it is defined in the attached claims.

I claim:

1. An integrated circuit, comprising a differential MESFET transistor pair with each MESFET coupled to a supply voltage via a respective load, an input for supplying an analog input voltage to a control electrode of one transistor of said transistor pair thereby to produce switching of the transistor pair, a node between the respective MESFET and its associated load being coupled to a sub-circuit for controlling the sub-circuit, and smoothing means coupled to said MESFET transistors for smoothing fluctuations of an output impedance of said differential MESFET transistor pair during switching thereof.

2. An integrated circuit as claimed in claim 1, wherein the smoothing means comprises, connected between each of said MESFETs and its associated load, a respective cascode transistor which is biased at a predetermined voltage, a node between each cascode transistor and an associated load being coupled to the sub-circuit.

3. An integrated circuit as claimed in claim 2, wherein the smoothing means comprises a feedback means which controls each of the MESFETs of the differential transistor pair via a signal indicative of a voltage appearing across the other MESFET of the differential pair.

4. An integrated circuit as claimed in claim 1, wherein the smoothing means comprises a feedback means which controls each of the MESFETs of the differential transistor pair via a signal indicative of a voltage appearing across the other MESFET of the differential pair.

5. An integrated circuit as claimed in claim 4, wherein, to provide said feedback means, each MESFET of the differential transistor pair comprises a first gate electrode and a second gate electrode for receiving input signals and for connection to the other MESFET of the differential pair, respectively.

6. An integrated circuit as claimed in claim 2, wherein each MESFET of the differential MESFET transistor pair comprises a first gate electrode for receiving input signals and a second gate electrode providing a feedback connection to the other MESFET of the differential transistor pair.

7. An analog-to digital converter comprising:
input means for receiving an analog input signal,
a plurality of parallel-connected integrated circuits each as claimed in claim 1, each having a respective output, wherein said sub-circuit thereof comprises a clocked bistable storage circuit,
means for coupling a first input of each integrated circuit to said input means and a second input of each integrated circuit to a different value reference voltage,
means coupling respective outputs of the integrated circuits to an encoding device which provides at an output thereof a digital output signal indicative of said analog input signal.

8. A voltage comparator comprising:
a comparison stage for comparing an analog input voltage ($V_{in}$) with an analog reference voltage ($V_{REF}$) and which comprises first and second field effect transistors connected together as a differential transistor pair with said input voltage and said reference voltage applied to respective control electrodes of the first and second transistors thereby to produce switching of the transistors at a given voltage level of said input voltage, and a current source coupled to intercoupled first main electrodes of said first and second transistors,
first and second load impedances for said first and second transistors, respectively,
an output stage for developing a pair of complementary output signals,
smoothing means coupling outputs of said first and second transistors to said first and second load impedances thereby to smooth output imedance fluctuations of said differential transistor pair during switching thereof, and
means for coupling said output stage to said differential transistor pair via said smoothing means and to said first and second load impedances.

9. A voltage comparator as claimed in claim 8, wherein said current source includes a transistor having a control electrode coupled to a terminal for receiving a clock voltage, and
said output stage comprises third and fourth transistors coupled together as a second differential transistor pair.

10. A voltage comparator as claimed in claim 9, wherein said smoothing means comprises first and second cascode connected transistors coupled between the outputs of said first and second field-effect transistors, respectively, and said first and second load impedances, respectively, and means for biasing each of said first and second cascode transistors at a given voltage level.

11. A voltage comparator as claimed in claim 10, further comprising feedback means which control each of the transistors of the first differential transistor pair by means of a signal proportional to a voltage appearing across the other transistor of said first differential transistor pair.

12. A voltage comparator as claimed in claim 11, wherein, as part of said feedback means, each of said first and second field effect transistors includes a second control electrode cross-coupled to a second main electrode of the other field effect transistor of the first differential transistor pair.

13. A voltage comparator as claimed in claim 8, wherein said smoothing means comprises first and second cascode connected transistors coupled between said first and second field-effect transistors, respectively, and said first and second load impedances, respectively, and means for biasing each of said first and second cascode transistors so as to maintain a constant voltage level at control electrodes of the first and second cascode transistors during switching of the first and second field effect transistors.

14. A voltage comparator as claimed in claim 8, further comprising feedback means which control each of the transistors of the first differential transistor pair by means of a signal proportional to a voltage appearing across the other transistor of said first differential transistor pair.

15. A voltage comparator as claimed in claim 8, wherein each of said first and second field effect transistors includes a second control electrode cross-coupled to a second main electrode of the other field effect transistor of the first differential transistor pair.

16. A voltage comparator as claimed in claim 15, wherein said current source includes a further transistor having a control electrode coupled to a terminal for receiving a clock voltage, and said output stage comprises thrid and fourth transistors coupled together as a second differential transistor pair.

17. A voltage comparator as claimed in claim 14, wherein said current source includes a further transistor having a control electrode coupled to a terminal for receiving a clock voltage, and said output stage comprises third and fourth transistors coupled together as a second differential transistor pair.

18. A voltage comparator as claimed in claim 15, further comprising feedback means which include said second cross-coupled control electrodes, where said feedback means control each of the transistors of the first differential transistor pair by means of a signal proportional to a voltage appearing across the other transistor of said first differential transistor pair.

19. A voltage comparator as claimed in claim 9, wherein said third and fourth transistors each have a control electrode coupled to said clock voltage terminal.

* * * * *